United States Patent
Clark et al.

(10) Patent No.: US 6,707,753 B2
(45) Date of Patent: Mar. 16, 2004

(54) LOW POWER DOMINO TREE DECODER

(75) Inventors: Lawrence T. Clark, Phoenix, AZ (US); Neil F. Deutscher, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 115 days.

(21) Appl. No.: 10/106,975

(22) Filed: Mar. 25, 2002

(65) Prior Publication Data

US 2003/0179638 A1 Sep. 25, 2003

(51) Int. Cl.[7] .................................................. G11C 7/00
(52) U.S. Cl. ........................... 365/230.06; 365/230.01; 365/230.03; 365/230.09; 365/236
(58) Field of Search ....................... 365/230.01, 230.06, 365/230.03, 230.09, 236

(56) References Cited

U.S. PATENT DOCUMENTS

| | | | | |
|---|---|---|---|---|
| 5,343,090 A | * | 8/1994 | Proebsting | 326/21 |
| 5,369,621 A | * | 11/1994 | Mason | 365/230.06 |
| 5,550,487 A | * | 8/1996 | Lyon | 326/33 |
| 5,783,949 A | * | 7/1998 | Reohr et al. | 326/106 |
| 6,408,421 B1 | * | 6/2002 | Benes et al. | 714/795 |
| 6,429,795 B1 | * | 8/2002 | Amstutz | 341/102 |
| 6,594,184 B2 | * | 7/2003 | Staraitis et al. | 365/189.08 |
| 2003/0043617 A1 | * | 3/2003 | Staraitis et al. | 365/154 |
| 2003/0140698 A1 | * | 7/2003 | Garverick et al. | 73/514.18 |
| 2003/0141899 A1 | * | 7/2003 | Tzartzanis et al. | 326/81 |

FOREIGN PATENT DOCUMENTS

JP    2000165247 A   *   6/2000

* cited by examiner

Primary Examiner—Viet Q. Nguyen
(74) Attorney, Agent, or Firm—Lanny L. Parker

(57) ABSTRACT

An integrated circuit having CMOS domino logic arranged in multistages or a tree structure. The multistage cells and addressing structure may have applications in a decoder and reduce the number of cells being precharged and reduce the operating power.

24 Claims, 3 Drawing Sheets

LOW POWER DOMINO TREE DECODER

Due to the high degree of miniaturization possible today in semiconductor technology, the size and complexity of designs that may be implemented in hardware has increased dramatically. This has made it technologically feasible and economically viable to develop high-speed applications-specific architectures featuring a performance increase over previous architectures. Process scaling has been used in the miniaturization process to reduce the area needed for logic functions in an effort to lower the product costs. Process scaling continues to improve performance but at the expense of power.

Precharged Complementary Metal Oxide Semiconductor (CMOS) domino logic techniques may be applied to functional blocks to reduce power. Domino logic forms an attractive design style for high performance designs since its low switching threshold and reduced transistor count leads to fast and area efficient circuit implementations. Thus, domino CMOS has become a prevailing logic family for many high performance CMOS applications and is used in many state-of-the-art processors due to its high speed capabilities.

However, domino logic suffers from several design problems and one of the most notable design problems is the charge-sharing problem. In domino logic there are two operational phases, a pre-charge phase and an evaluation phase. The charge-sharing problem occurs when the charge that may be stored at the output node in the pre-charge phase is shared among the junction capacitance of transistors in the evaluation phase. Charge sharing may degrade the output voltage level or even cause an erroneous output value.

One drawback of domino CMOS is that the logic is precharged making the design sensitive to power constraints. Thus, there is a continuing need for better ways to provide flexibility for operating a microprocessor, memory or other circuit having domino logic while preserving low operating currents.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
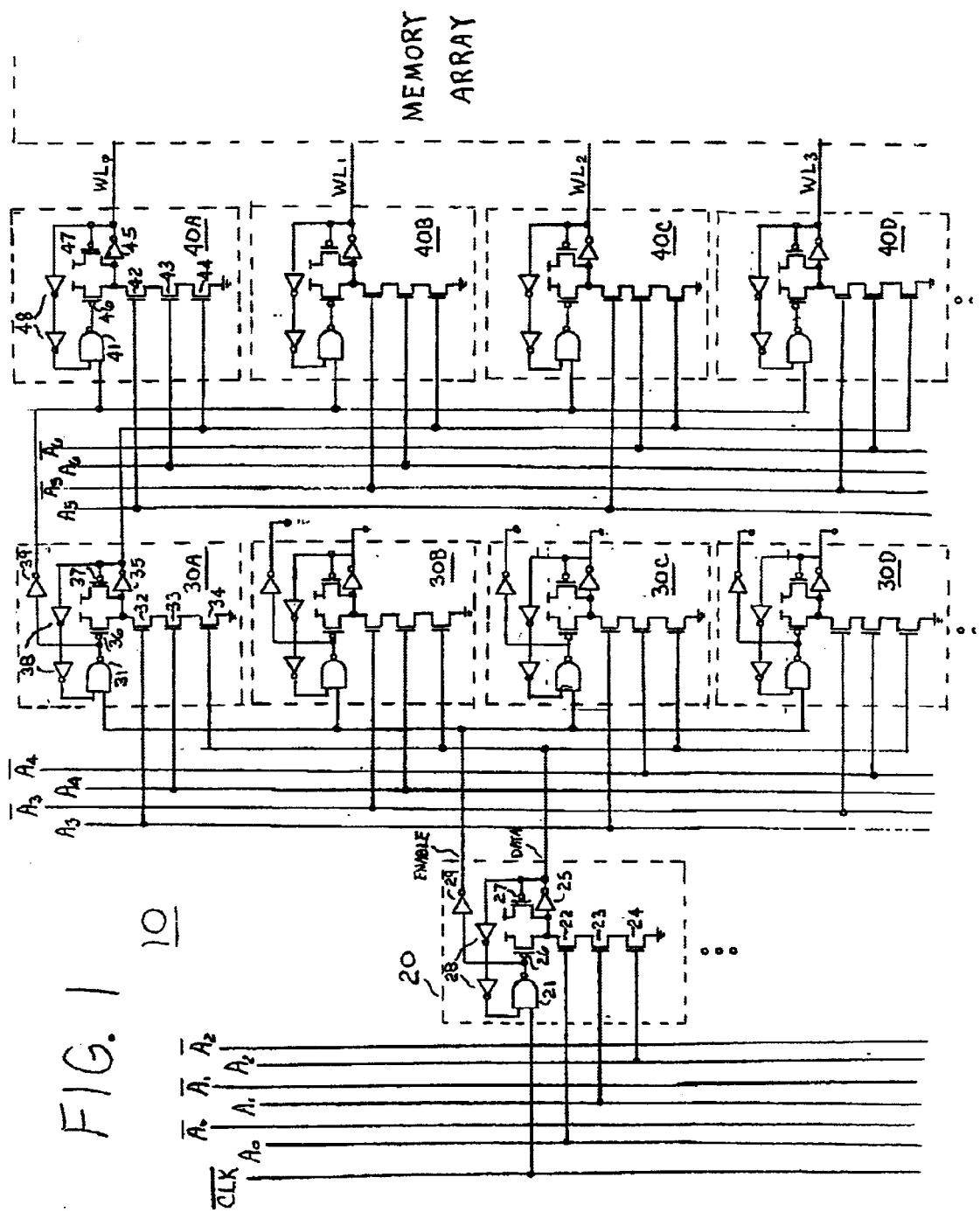
FIG. 1 is a word line decoder circuit in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Embodiments of the present invention may be used in a variety of applications. Although the present invention is not limited in this respect, the circuits disclosed herein may be used in microcontrollers, general-purpose microprocessors, Digital Signal Processors (DSPs), Reduced Instruction-Set Computing (RISC), Complex Instruction-Set Computing (CISC), among other electronic components. However, it should be understood that the scope of the present invention is not limited to these examples.

Embodiments of the present invention may also be included in integrated circuit blocks referred to as core memory, cache memory, or other types of memory that store electronic instructions to be executed by the microprocessor or store data that may be used in arithmetic operations. In general, an embodiment using multistage domino logic in accordance with the claimed subject matter may provide a benefit to microprocessors, and in particular, may be incorporated into an address decoder for a memory device. Note that the embodiments may be integrated into radio systems or hand-held portable devices, especially when devices depend on reduced power consumption. Thus, laptop computers, cellular radiotelephone communication systems, two-way radio communication systems, one-way pagers, two-way pagers, personal communication systems (PCS), personal digital assistants (PDA's), cameras and other products are intended to be included within the scope of the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Turning to FIG. 1, multistage decoder 10 is an embodiment using multistage domino logic in accordance with the claimed subject matter to generate word lines for a stand-alone memory, a cache memory or any memory embedded with a microprocessor. Although multistage decoder 10 has applications in a word line decoder, it is not limited to embodiments associated only with memory addressing. Multistage decoder 10 has applications in types of circuitry other than decoders that may use multistages or a tree structure.

In the embodiment shown, multistage decoder 10 receives a clock signal $\overline{CLK}$, address signals A0-A6, and complemented address signals and generates a word line for a memory array. The memory array (not shown) may be comprised of Static Random Access Memory (SRAM) cells, Dynamic Random Access Memory (DRAM) cells, non-volatile flash memory cells, non-volatile ferroelectric memory devices, or Ovonic Unified Memory (OUM) devices, among others. It is intended that the claimed subject matter not be limited by the type, size, or blocking of the memory array. Although this embodiment shows address signals A6-A0 and their complements that may be used to select one of the 128 word lines, other embodiments for a word line decoder may have more address signals or fewer address signals.

A first stage cell 20 has serially connected N-channel transistors 22, 23 and 24, that form a stack. The source terminal of transistor 24 may be connected to a power conductor to receive a ground reference and the drain terminal of transistor 22 may be commonly connected to the drain terminals of P-channel transistors 26 and 27. The source terminals of transistors 26 and 27 may be commonly connected to another power conductor to receive a positive voltage potential. The drain terminal of transistor 22 may also be connected to the input of an inverter 25, with the output of the inverter being connected to the gate of transistor 27 and further connected to an output of first stage cell 20. In addition, the data output signal generated by inverter 25 may be coupled through a buffer 28 to one input of a NAND gate 21. In this embodiment buffer 28 may include two serially connected inverters. The other input of NAND gate 21 may receive the signal $\overline{CLK}$. The output of NAND gate 21 may be commonly connected to the gate of transistor 26 and to the input of an inverter 29. The output of inverter 29 provides an enable signal as another output of first stage cell 20.

A middle stage cell 30 has N-channel transistors 32, 33 and 34, P-channel transistors 36 and 37, inverters 35 and 39 and a NAND gate 31 that are arranged like the corresponding devices of first stage cell 20. For instance, serially connected N-channel transistors 32, 33 and 34 form a stack, with the source terminal of transistor 34 connected to the power conductor that receives the ground reference. Note that all gates in the stack are at ground potential and the top of the stack is precharged, thereby limiting source-to-drain leakage currents within the stack. The drain terminal of transistor 32 may be coupled through transistors 36 and 37 to the power conductor that receives the positive voltage potential. The drain terminal of transistor 32 may be connected to the input of an inverter 35, with the output of the inverter being connected to the gate of transistor 37 and also connected to an output of middle stage cell 30. The data output signal generated by inverter 35 may be coupled through a buffer 38 to one input of a NAND gate 31. The other input of NAND gate 31 may be connected to the output of inverter 29 of first stage cell 20. The output of NAND gate 31 may be connected to the gate of transistor 36 and further connected to the input of an inverter 39. The output of inverter 39 provides an enable signal as another output of middle stage cell 30.

A final stage cell 40 has N-channel transistors 42, 43 and 44, P-channel transistors 46 and 47, an inverter 45 and a NAND gate 41 that are also arranged like the corresponding devices of first stage cell 20. Serially connected N-channel transistors 42, 43 and 44 form a stack, with the source terminal of transistor 44 connected to the power conductor that receives the ground reference. The drain terminal of transistor 42 may be coupled through transistors 46 and 47 to the power conductor that receives the positive voltage potential. The drain terminal of transistor 42 may be connected to the input of an inverter 45, with the output of the inverter being connected to the gate of transistor 47 and also connected to an output of final stage cell 40. Note that inverter 45 generates a word line output signal, e.g. a decoder output signal, in final stage cells 40. The word line output signal generated by inverter 45 may be coupled through a buffer 48 to one input of a NAND gate 41. The other input of NAND gate 41 may be connected to the output of inverter 39 of middle stage cell 30. The output of NAND gate 41 may be connected to the gate of transistor 46.

Although FIG. 1 shows one first stage cell 20 for simplicity and clarity of illustration, it should be noted that eight first stage cells 20 are included in this embodiment for the word line decoder that generates 128 word line signals. The eight first stage cells 20 receive combinations of three address signals ($A_2$-$A_0$) and/or the complemented address signals at the gates of the stack transistors 22, 23 and 24. One skilled in the art could correctly connect the address signals and complemented address signals to the stack transistors in the eight first stage cells 20. Thus, transistors 22, 23 and 24 in one first stage cell 20 may receive address signals $A_2$-$A_0$ of 111, while transistors 22, 23 and 24 of another first stage cell 20 may receive address signals $A_2$-$A_0$ having binary values of 110, . . . , and transistors 22, 23 and 24 of yet another first stage cell 20 may receive address signals $A_2$-$A_0$ having binary values of 000. Note that a logic 1 value implies that first stage cell 20 receives the address signal and a logic 0 value implies that the stack transistor receives the corresponding complemented address signal.

Further, FIG. 1 shows four middle stage cells 30A, 30B, 30C and 30D for simplicity and clarity of illustration, but it should be noted that a total of thirty-two middle stage cells 30 are included in this embodiment. Note that each of the first stage cells generates two signals that are supplied to four of the middle stage cells. By way of example, first stage cell 20 generates two signals that are supplied to middle stage cells 30A, 30B, 30C and 30D. Thus, each of the inverters 25 and 29 in the first stage cells has a fan out of four.

The thirty-two middle stage cells 30 receive combinations of the address signals $A_4$-$A_3$ and/or the complemented address signals at the gates of the stack transistors 32 and 33. It should be pointed out that an inverter 25 in one of the first stage cells generates a signal that is supplied to stack transistor 34 in four of the middle stage cells. Again, one skilled in the art could connect the address signals and complemented address signals to the stack transistors in the thirty-two middle stage cells 30. By way of example, transistors 32 and 33 in middle stage cell 30A may receive address signals $A_4$-$A_3$ of 11, transistors 32 and 33 of middle stage cell 30B may receive address signals $A_4$-$A_3$ having binary values of 10, transistors 32 and 33 of middle stage cell 30C may receive address signals $A_4$-$A_3$ having binary values of 01, and transistors 32 and 33 of middle stage cell 30D may receive address signals $A_4$-$A_3$ having binary values of 00. Again, note that a value of 1 implies that middle stage cell 30 receives the address signal and a value of 0 implies that the stack transistor receives the corresponding complemented address signal.

FIG. 1 also shows four final stage cells 40A, 40B, 40C and 40D for simplicity and clarity of illustration, but it should be noted that a total of one hundred and twenty-eight final stage cells 40 are included in this embodiment. Note that each of the middle stage cells generates two signals that are supplied to four of the final stage cells. By way of example, middle stage cell 30A generates two signals that are supplied to final stage cells 40A, 40B, 40C and 40D. Thus, each of the inverters 35 and 39 in the middle stage cells has a fan out of four.

The one hundred and twenty-eight final stage cells 40 receive combinations of the address signals $A_6$-$A_5$ and/or the complemented address signals at the gates of the stack transistors 42 and 43. It should be pointed out that an inverter 35 in one of the middle stage cells generates a signal that is supplied to stack transistor 44 in four of the final stage cells. Again, one skilled in the art could connect the address signals and complemented address signals to the stack transistors in the one hundred and twenty-eight final stage cells 40. By way of example, transistors 42 and 43 in final stage cell 40A may receive address signals $A_6$-$A_5$ of 11, transistors 42 and 43 of final stage cell 40B may receive address signals $A_6$-$A_5$ of 10, transistors 42 and 43 of final stage cell 40C may receive address signals $A_6$-$A_5$ of 01, and transistors 42 and 43 of final stage cell 40D may receive address signals $A_6$-$A_5$ of 00. Again, note that values of 1 imply the address signal is received and values of 0 imply that the stack transistors receive the corresponding complemented address signal.

Figure 2:
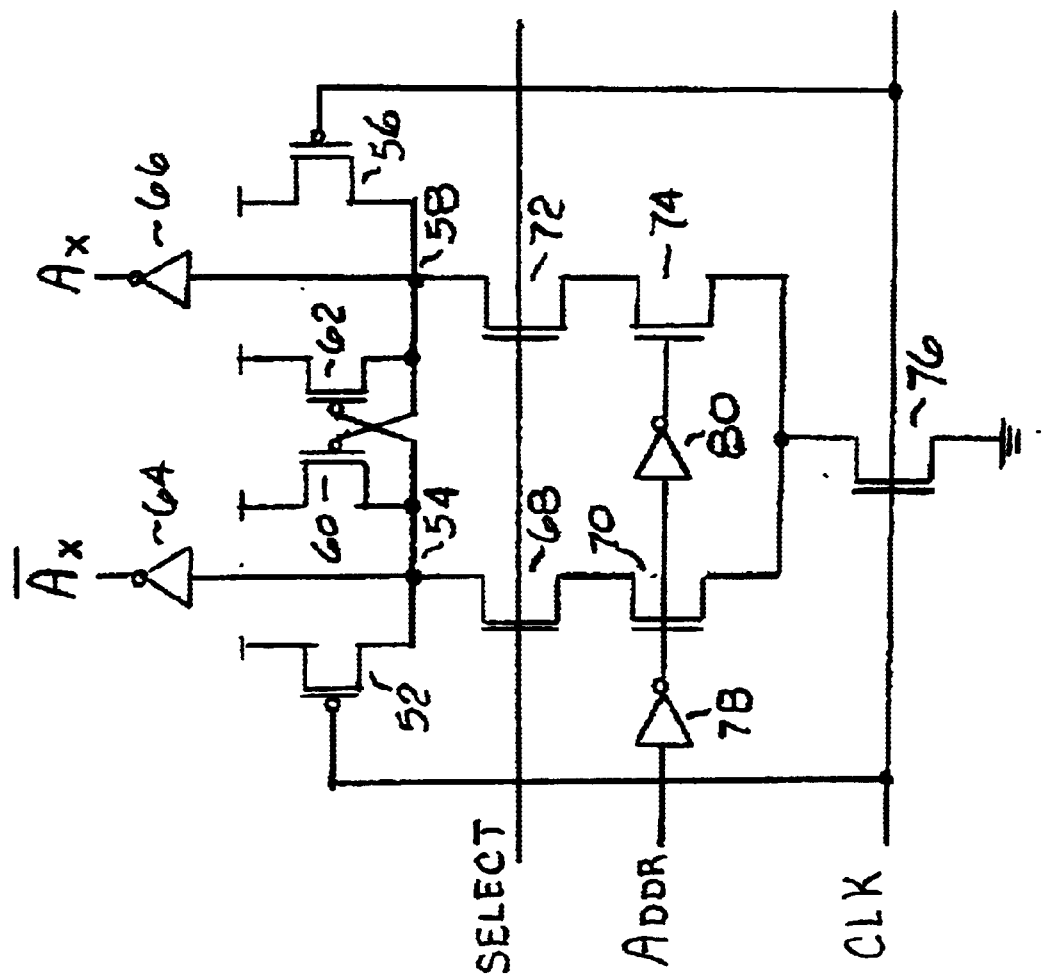
FIG. 2 is a circuit diagram for an address driver that may be used to provide address signals and complement address signals to the circuit of FIG. 1.

FIG. 2 is a circuit diagram for an address driver 50 that may be used to provide the address signals $A_6$-$A_0$ along with the complemented address signals to multistage decoder 10 of FIG. 1. Address driver 50 receives one of the address signal inputs and generates the true and complemented address signals that may be supplied either to first stage cells 20, middle stage cells 30 or final stage cells 40 as appropriate. P-channel transistors 52 and 56 may receive the clock signal CLK and provide a precharge voltage potential to respective nodes 54 and 58. A selectable electrical conduction path may couple node 54 to a ground reference through N-channel transistors 68, 70 and 76, where transistor 68 receives the signal SELECT, transistor 70 receives an address signal ADDR inverted by inverter 78 and transistor 76 receives the clock signal CLK. Also, a selectable electrical conduction path may couple node 58 to the ground reference potential through N-channel transistors 72, 74 and 76, where transistor 72 receives the signal SELECT, transistor 74 receives the address signal ADDR after buffering by inverters 78 and 80 and transistor 76 receives the clock signal CLK.

Further, cross-coupled P-channel transistors 60 and 62 have drain terminals connected to respective nodes 54 and 58 and source terminals connected to a power conductor that receives a positive voltage potential. An inverting buffer 64 couples the voltage potential at node 54 to an output that provides the complement of the signal $A_X$, where $A_X$ represents one of the address signals $A_6$-$A_0$. Another inverting buffer 66 couples the voltage potential at node 58 to an output that provides the address signal $A_X$. Note that when the clock signal CLK is low, the address signals $A_6$-$A_0$ and their complement address signals are precharged to a low logic level. This effectively disables all of the decoder outputs. Thus, the address signals are asserted differentially, e.g. the address signal and it's complement have differing binary logic values, in one clock phase and deasserted in another clock phase.

Figure 3:
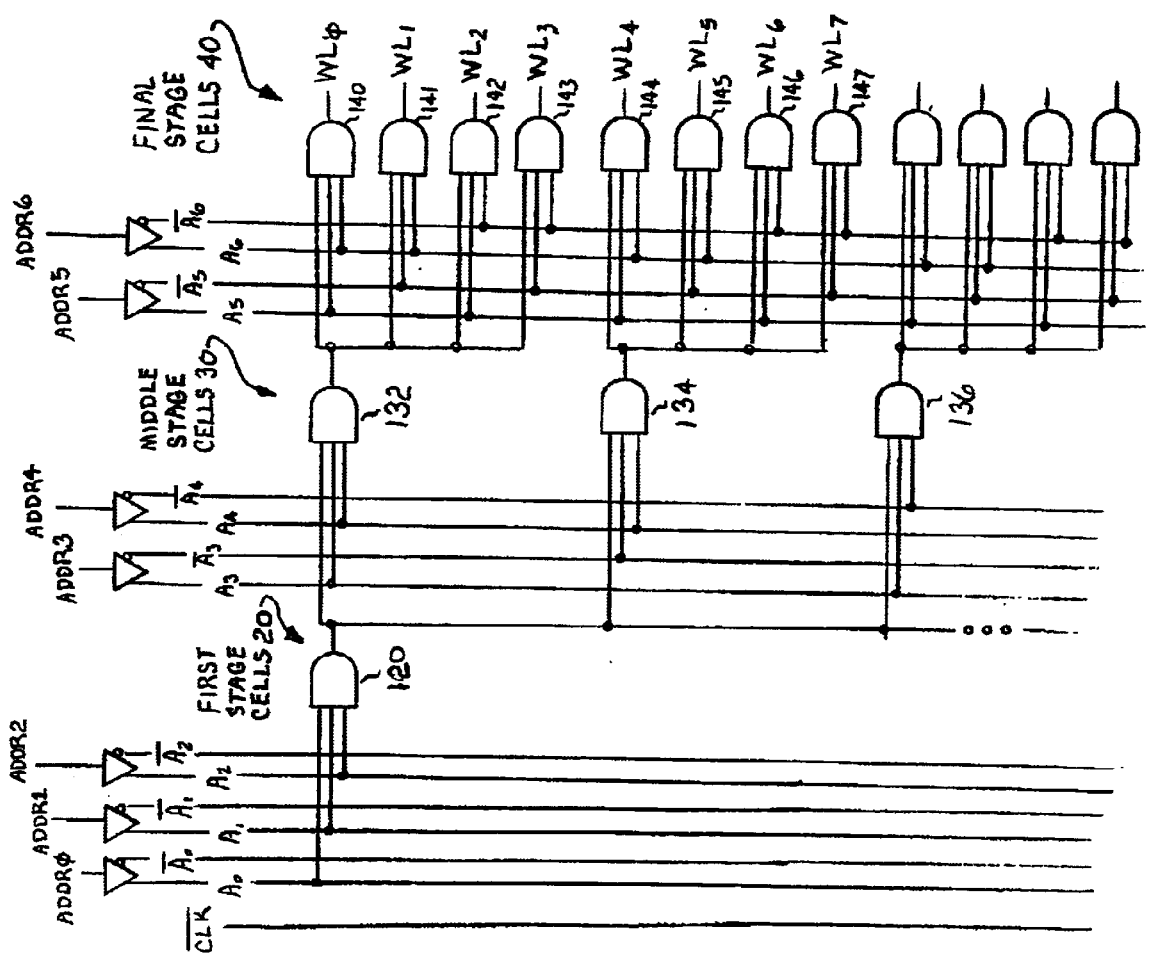
FIG. 3 is a circuit diagram that illustrates the feed forward paths in the decoder.

FIG. 3 is a circuit diagram that illustrates the feed forward paths in multistage decoder 10. Included in FIG. 3 are the AND gates that generate the feed forward signals (see FIG. 1) and the address drivers (see FIG. 2) that generate the addresses. AND gate 120 represents the N-channel stack transistors 22, 23 and 24, the P-channel pull-up transistor 26 and inverter 25 in one of the first stage cells 20 as shown in FIG. 1. AND gate 132 represents the N-channel stack transistors 32, 33 and 34, the P-channel pull-up transistor 36 and inverter 35 in middle stage cell 30A. AND gates 134–136, among others, represent stack transistors, pull-up transistors and inverters in other middle stage cells. Likewise, AND gate 140 represents the N-channel stack transistors 42, 43 and 44, the P-channel pull-up transistor 46 and inverter 45 in final stage cell 40A. AND gates 141–147, among others, represent stack transistors, pull-up transistors and inverters in other final stage cells. Clock signals have not been shown in FIG. 3 for simplicity.

In operation, the address signals $A_6$-$A_0$ and the complement address signals may be generated synchronous to the transition of the clock signal CLK. Prior to the transition of the clock signal and with the clock signal CLK at a low logic level, transistors 52 and 56 may precharge nodes 54 and 58 to a high logic level and both the address and complemented address signal have low logic values. When the clock signal CLK transitions, if the address input signal ADDR has a high logic level, then the conduction path that comprises transistors 68, 70 and 76 remains nonconductive. Further, the conduction path through transistors 72, 74 and 76 discharges node 58 when the clock signal CLK transitions (the signal SELECT is active high). With these input conditions, the address signal $A_X$ remains at a logic high level and the complemented address signal has a logic low level.

On the other hand, with address driver 50 selected and the address input signal ADDR at a low logic level, the conduction path that comprises transistors 68, 70 and 76 becomes conductive and discharges node 54 while the conduction path that comprises transistors 72, 74 and 76 is nonconductive. With these input conditions, the address signal $A_X$ has a logic low level and the complemented address signal remains at a logic high level. Note that address driver 50 is replicated seven times for this embodiment, with each driver providing the true and complemented address signals to multistage decoder 10 for one of the addresses $A_6$ through $A_0$.

In general, the domino logic illustrated in FIG. 1 is not self-timed dynamic logic, but rather domino logic that provides a select or clock-gating element (an AND gate shown in FIG. 3) that propagates a clock-gated signal through one of eight first stage cells 20, one of thirty-two middle stage cells 30 to activate one of one hundred and twenty-eight final stage cells 40. Thus, even though each of the eight first stage cells 20 receive the clock signal $\overline{CLK}$, only one first stage cell 20 propagates a clock-gated signal in accordance with the address signals $A_2$-$A_0$. Thus, one first stage cell 20 generates a logic high value at the output of inverter 25, which in turn enables NAND gate 21 to propagate the clock-gated clock output from inverter 29 to the four fan-out gates of middle stage cells 30. The clock delay provided by buffer 28, NAND gate 21 and inverter 29 ensures that the clock output's evaluation edge for the fan-out gates occurs when the output from inverter 25 is stable, and prevents crow-bar current in the subsequent gates in middle stage cells 30.

Note that the other seven first stage cells 20 provide logic low values at the outputs of inverters 25 and 29, and thus, disable the middle stage cells 30 to which they supply signals from precharging. Further note that the clock signal $\overline{CLK}$ is used to initiate a precharge pulse and propagate a gated clock signal in selected cells of multistage decoder 10 and the NAND gate, along with the three inverters in the feedback path, provide a self-timed end to the precharge pulse. Generally, since the clock initiates the precharge operation, it is not considered critical to the speed of operation. Consequently, the decoder speed to generate a word line output signal is limited by the forward propagation through devices such as NMOS stack devices 22, 23 and 24, and inverter 25 (an AND function) in first stage cell 20, and similar devices in cells in the other stages.

Four middle stage cells 30 receive the clock-gated clock output from inverter 29 of the first stage cell 20, but only one of these middle stage cells 30 generates a clock-gated clock output in accordance with the address signals $A_4$-$A_3$. Thus, one middle stage cell 30 generates a logic high value at the output of inverter 35, which in turn enables NAND gate 31 to propagate the clock-gated clock output from inverter 39 to the four fan-out gates of final stage cells 40. Again, the clock delay provided by buffer 38, NAND gate 31 and inverter 39 ensures that the clock output's evaluation edge for the fan-out gates occurs when the output from inverter 35 is stable, and prevents false evaluation of the subsequent gates in final stage cells 40. Note that the other thirty-one middle stage cells 30 provide a logic low values at the outputs of inverters 35 and 39, and thus, disable the final stage cells 40 to which they supply signals from precharging.

In this embodiment, four final stage cells 40 receive the clock-gated clock output from inverter 39 of the middle stage cell 30, but only one of these final stage cells 40 provides a logic high on the word line output in accordance with the address signals $A_6$-$A_5$. One of the advantages of multistage decoder 10 is the use of NAND domino logic in a decoder structure that uses multistages or tree structures to reduce the number of cells being precharged, and thereby, reduces the operating power.

FIG. 3 illustrates some of the feed forward propagation paths through AND gates in multistage decoder 10 to generate a word line signal. Again, the AND gates correspond to the devices such as NMOS stack devices 22, 23 and 24, and inverter 25 (an AND function) in first stage cell 20, and similar devices in cells in the other stages. One example of a forward propagation path through multistage decoder 10 may be a signal propagating through AND gates 120, 132 and 140 to generate word line $WL_0$ in accordance with the proper address signals supplied to the decoder. When the clock signal CLK transitions to a logic high value, the address is provided differentially to allow a signal to propagate through one cell in each of the first, middle and final stages cells and generate a word line signal. Note that even though the signal propagates from AND gate 120 to AND gates 132, 134, 136, etc., only AND gate 132 in middle stage 30 receives the proper addressing and propagates the signal further. Thus, in this example, AND gates 134, 136 do not propagate a signal. Likewise, the signal propagates from AND gate 132 to AND gates 140, 141, 142 and 143, but only AND gate 140 receives the proper addressing in this example and propagates the signal to generate word line $WL_0$. Thus, in this example, AND gates 141, 142 and 143 do not receive addressing that allow these gates to propagate a signal.

Following the propagation of a signal through the first, middle and final stages of multistage decoder 10, i.e. represented by AND gates 120, 132 and 140, a precharge cycle allows the three cells that propagated the signal through multistage decoder 10 to precharge. Operating power is reduced because only the cells that propagated the signal are precharged.

By now it should be clear that embodiments have been presented for a decoder such as, for example, a word line decoder using domino logic configured for high frequency switching applications and power reduction. For the embodiment of multistage decoder 10 having eight first stage cells 20, thirty-two middle stage cells 30 and one hundred and twenty-eight final stage cells 40, the decoder provides a decoder output signal and in so doing, three cells are precharged, i.e., one selected cell from the first, middle, and final stage. Clock toggling occurs on four middle stage gates and four final stage gates.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A multistage decoder comprising first and second stages, wherein the first stage includes domino logic coupled to receive a clock signal and a first group of address signals and generate a data signal and an enable signal, and the second stage includes domino logic coupled to receive the data signal, the enable signal and a second group of address signals and generate a decoder output signal.

2. The multistage decoder of claim 1 wherein the decoder output signal is a word line signal for a memory.

3. The multistage decoder of claim 1, wherein the first stage includes:

a stack of transistors coupled to receive the first group of address signals;

first and second pull-up transistors having drain terminals coupled to the stack and source terminals coupled to a power conductor;

a first inverter to provide the data signal and having an input coupled to the drain terminals of the first and second pull-up transistors and an output coupled to a gate terminal of the second pull-up transistor;

a NAND gate having a first input coupled to an output of the first inverter and a second input coupled to receive the clock signal and an output coupled to a gate terminal of the first pull-up transistor; and a second inverter having an input coupled to an output of the NAND gate and an output to provide the enable signal.

4. The multistage decoder of claim 3, further including third and fourth inverters that are serially connected, where an input of the third inverter is coupled to the output of the first inverter and an output of the fourth inverter is coupled to the first input of the NAND gate.

5. The multistage decoder of claim 1, wherein the second stage includes:

a stack of transistors coupled to receive the second group of address signals and the data signal;

first and second pull-up transistors having drain terminals coupled to the stack and source terminals coupled to a power conductor;

a first inverter to provide the data signal and having an input coupled to the drain terminals of the first and second pull-up transistors and an output coupled to a gate terminal of the second pull-up transistor; and a NAND gate having a first input coupled to an output of the first inverter and a second input coupled to receive the enable signal and an output coupled to a gate terminal of the first pull-up transistor.

6. The multistage decoder of claim 5, further including third and fourth inverters that are serially connected, where an input of the third inverter is coupled to the output of the first inverter and an output of the fourth inverter is coupled to the first input of the NAND gate.

7. A multistage decoder circuit, comprising:

a first stage that includes domino logic coupled to receive a clock signal and a first group of address signals and generate a data signal and an enable signal; and a second stage that includes domino logic coupled to receive the data signal, the enable signal and a second group of address signals and generate a decoder output signal.

8. The multistage decoder circuit of claim 7, wherein the first and second groups of address signals are asserted differentially in one clock phase and deasserted in another clock phase.

9. The multistage decoder circuit of claim 7, wherein the first stage further comprises:

a stack of transistors coupled to receive address signals a;

first and second pull-up transistors having drain terminals coupled to the stack and source terminals coupled to a power conductor;

a first inverter to provide a data signal and having an input coupled to the drain terminals of the first and second pull-up transistors and an output coupled to a gate terminal of the second pull-up transistor;

a NAND gate having one input coupled to an output of the first inverter and a second input coupled to receive a clock signal and an output coupled to a gate terminal of the first pull-up transistor; and a second inverter having an input coupled to an output of the NAND gate and an output to provide an enable signal.

10. The multistage decoder circuit of claim 9, wherein the second stage further comprises:

a stack of transistors coupled to receive address signals and the data signal;

first and second pull-up transistors having drain terminals coupled to the stack and source terminals coupled to the power conductor;

a first inverter to provide the decoder output signal and having an input coupled to the drain terminals of the first and second pull-up transistors and an output coupled to a gate terminal of the second pull-up transistor; and a NAND gate having one input coupled to an output of the first inverter and a second input coupled to receive the enable signal and an output coupled to a gate terminal of the first pull-up transistor.

11. A system, comprising:

a multistage decoder comprising first and second stages, wherein the first stage includes domino logic coupled to receive a clock signal and a first group of address signals and generate a data signal and an enable signal, and the second stage includes domino logic coupled to receive the data signal, the enable signal and a second group of address signals and generate a decoder output signal; and a memory array coupled to the multistage decoder to receive the decoder output signal.

12. The system of claim 11, wherein the first stage includes:

a stack of transistors coupled to receive the first group of address signals;

first and second pull-up transistors having drain terminals coupled to the stack and source terminals coupled to a power conductor;

a first inverter to provide the data signal and having an input coupled to the drain terminals of the first and second pull-up transistors and an output coupled to a gate terminal of the second pull-up transistor;

a NAND gate having a first input coupled to an output of the first inverter and a second input coupled to receive the clock signal and an output coupled to a gate terminal of the first pull-up transistor; and a second inverter having an input coupled to an output of the NAND gate and an output to provide the enable signal.

13. The multistage decoder of claim 12, further including third and fourth inverters that are serially connected, where an input of the third inverter is coupled to the output of the first inverter and an output of the fourth inverter is coupled to the first input of the NAND gate.

14. The multistage decoder of claim 11, wherein the second stage includes:

a stack of transistors coupled to receive the second group of address signals and the data signal;

first and second pull-up transistors having drain terminals coupled to the stack and source terminals coupled to a power conductor;

a first inverter to provide the decoder output signal and having an input coupled to the drain terminals of the first and second pull-up transistors and an output coupled to a gate terminal of the second pull-up transistor; and a NAND gate having a first input coupled to an output of the first inverter and a second input coupled to receive the enable signal and an output coupled to a gate terminal of the first pull-up transistor.

15. The multistage decoder of claim 14, further including third and fourth inverters that are serially connected, where an input of the third inverter is coupled to the output of the first inverter and an output of the fourth inverter is coupled to the first input of the NAND gate.

16. A method, comprising:

addressing multiple first stage cells of a decoder that include domino logic to select one first stage cell to generate a data signal and an enable signal; and addressing multiple second stage cells of the decoder that include domino logic to select one second stage cell that receives the data signal and the enable signal to provide a decoder output signal.

17. The method of claim 16, further comprising using the decoder output signal as a word line signal to a memory.

18. The method of claim 16, further comprising precharging the domino logic of the selected one first stage cell and the selected one second stage cell and not precharging the domino logic of nonselected first stage cells and nonselected second stage cells.

19. The method of claim 16, further comprising providing address signals to the multiple first stage cells that are different from address signals provided to the multiple second stage cells.

20. A method for decoding, comprising:

addressing first stage cells of a decoder that include domino logic to select one first stage cell to generate a feed forward signal; and receiving the feed forward signal at second stage cells of the decoder that include domino logic and an address to select one second stage cell to provide another feed forward signal.

21. The method of claim 20, further comprising:

providing a precharge cycle;

precharging the selected one first stage cell and the selected one second stage cell and not precharging nonselected first and second stage cells.

22. The method of claim 21, wherein precharging the selected one first stage cell further comprises:

receiving a signal to initiate a precharge pulse in the selected one first stage cell and providing a self-timed end to the precharge pulse after the selected one first stage cell is precharged.

23. The method of claim 22, further comprising:

propagating a gated clock signal from the selected one first stage cell to the selected one second stage cell.

24. The method of claim 23, further comprising:

using the gated clock signal in the selected one second stage cell to initiate a precharge pulse and providing a self-timed end to the precharge pulse after the selected one second stage cell is precharged.

* * * * *